(12) United States Patent  
Park

(10) Patent No.: US 7,659,661 B2
(45) Date of Patent: Feb. 9, 2010

(54) FULL COLOR OLED AND METHOD OF FABRICATING THE SAME

(75) Inventor: Joon-Young Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 402 days.

(21) Appl. No.: 11/273,088

(22) Filed: Nov. 15, 2005

(65) Prior Publication Data

US 2006/0102913 A1 May 18, 2006

(30) Foreign Application Priority Data

Nov. 17, 2004 (KR) .............. 10-2004-0094358

(51) Int. Cl.
*H01J 1/62* (2006.01)
*H01J 63/04* (2006.01)

(52) U.S. Cl. .............. 313/506; 313/504; 313/503

(58) Field of Classification Search .............. None
See application file for complete search history.

(56) References Cited

U.S. PATENT DOCUMENTS

| 5,898,271 | A * | 4/1999 | Mehrotra et al. .............. 313/582 |
| 6,506,506 | B1 * | 1/2003 | Tomiuchi et al. .............. 428/690 |
| 6,515,418 | B1 | 2/2003 | Geens et al. |
| 6,522,066 | B2 * | 2/2003 | Sheu et al. .............. 313/505 |
| 6,641,933 | B1 * | 11/2003 | Yamazaki et al. .............. 428/690 |
| 2003/0227254 | A1 * | 12/2003 | Terumoto .............. 313/504 |
| 2005/0093435 | A1 * | 5/2005 | Suh et al. .............. 313/504 |

FOREIGN PATENT DOCUMENTS

| CN | 1509123 | 6/2004 |
| JP | 11-204263 | 7/1999 |
| JP | 2000-026852 | 1/2000 |
| JP | 2000-173766 | 6/2000 |
| JP | 2001-093661 | 4/2001 |
| JP | 2001-217072 | 8/2001 |
| JP | 2004-022517 | 1/2004 |
| JP | 2004-220888 | 8/2004 |
| JP | 2004-319450 | 11/2004 |
| WO | 03-101155 | 12/2003 |

OTHER PUBLICATIONS

Chinese Office Action dated Jun. 19, 2009 for CN Application No. 200510123265.1.

* cited by examiner

*Primary Examiner*—Toan Ton
*Assistant Examiner*—Britt Hanley
(74) *Attorney, Agent, or Firm*—H.C. Park & Associates, PLC

(57) ABSTRACT

A full color organic light emitting display device (OLED) and a method of fabricating the same are provided. The OLED includes an element substrate and an encapsulating substrate. The element substrate includes a color filter layer or a color conversion layer, as well as an organic layer with an emission layer that emits light of a single color. The encapsulating substrate includes a color filter or a color conversion layer and a moisture absorbent, and a the color filter or color conversion layer corresponds to the emission region. Accordingly, there is no need to have a separate process for the moisture absorbent and the color filter layer or the color conversion layer may be formed without using a shadow mask, so that a high resolution OLED may be advantageously realized.

11 Claims, 5 Drawing Sheets

FULL COLOR OLED AND METHOD OF FABRICATING THE SAME

CROSS-REFERENCE TO RELATED APPLICATION

This application claims priority to and the benefit of Korean Patent Application No. 10-2004-0094358, filed Nov. 17, 2004, which is hereby incorporated by reference for all purposes as if fully set forth herein.

BACKGROUND OF THE INVENTION

1. Field of the Invention

The present invention relates to a full color organic light emitting display device (OLED) and a method of fabricating the same, and more particularly, to a full color dual emission OLED having a color conversion layer or a color filter layer with a moisture absorbent on an encapsulating substrate and a method of fabricating the same.

2. Discussion of the Background

Generally, an OLED includes a substrate, an anode arranged on the substrate, an emission layer (EML) arranged on the anode, a cathode arranged on the EML, and an encapsulating substrate. In such an OLED, applying a voltage between the anode and the cathode injects holes and electrons into the EML. The holes and electrons then recombine in the EML to generate excitons, which emit light when transitioning from an excited state to a ground state.

In order to realize a full color OLED, emission layers corresponding to respective red (R), green (G), and blue (B) light may be formed. However, the emission layers that emit R, G, and B light, respectively, have different lifetime characteristics. Hence, it may be difficult to maintain white balance over long periods of time, and there is a limitation in patterning each pixel so that a high-resolution display device may not be advantageously realized.

To cope with this problem, a method that includes forming an emission layer that emits a single color of light has been proposed. The method further includes forming a color filter layer for extracting light corresponding to a predetermined color from the light emitted from the emission layer, or forming a color conversion layer for converting the light emitted from the emission layer into light of a predetermined color. As an example thereof, U.S. Pat. No. 6,515,418 discloses an active matrix OLED including an emission layer that emits white light and a color filter layer formed by photolithography. Furthermore, U.S. Pat. No. 6,522,066 discloses an active matrix OLED including an emission layer that emits blue light and a color filter layer formed by photolithography.

An encapsulating substrate for protecting an anode, an emission layer, and a cathode is attached to the substrate. The emission layer is apt to be affected by moisture and oxygen, so that a moisture absorbent may be disadvantageously attached thereto after forming a separate region for mounting the moisture absorbent within the encapsulating substrate.

SUMMARY OF THE INVENTION

The present invention provides a full color OLED and a method of fabricating the same, with a color filter layer or a color conversion layer on an element substrate and with a color conversion layer or a color filter layer and a moisture absorbent on an encapsulating substrate such that alignment may be facilitated at the time of encapsulation and a high-resolution display device may be advantageously realized.

Additional features of the invention will be set forth in the description which follows, and in part will be apparent from the description, or may be learned by practice of the invention.

The present invention discloses a full color organic light emitting display device including an element substrate and an encapsulating substrate. The element substrate includes a pixel electrode, an organic layer having at least an emission layer, and a counter electrode, and the encapsulating substrate is coupled with the element substrate. Either a first color filter layer or a first color conversion layer is arranged on the element substrate, the emission layer emits light of a single color, and either a second color filter layer or a second color conversion layer has a moisture absorbent and is arranged on the encapsulating substrate to correspond to the emission layer.

The present invention also discloses a method of fabricating a full color organic light emitting display device including forming either a first color filter layer or a first color conversion layer on an element substrate, forming a pixel electrode on the element substrate, forming an organic layer including at least an emission layer on the pixel electrode, forming a counter electrode on the organic layer, and forming either a second color filter layer or a second color conversion layer having a moisture absorbent on an encapsulating substrate corresponding to the element substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
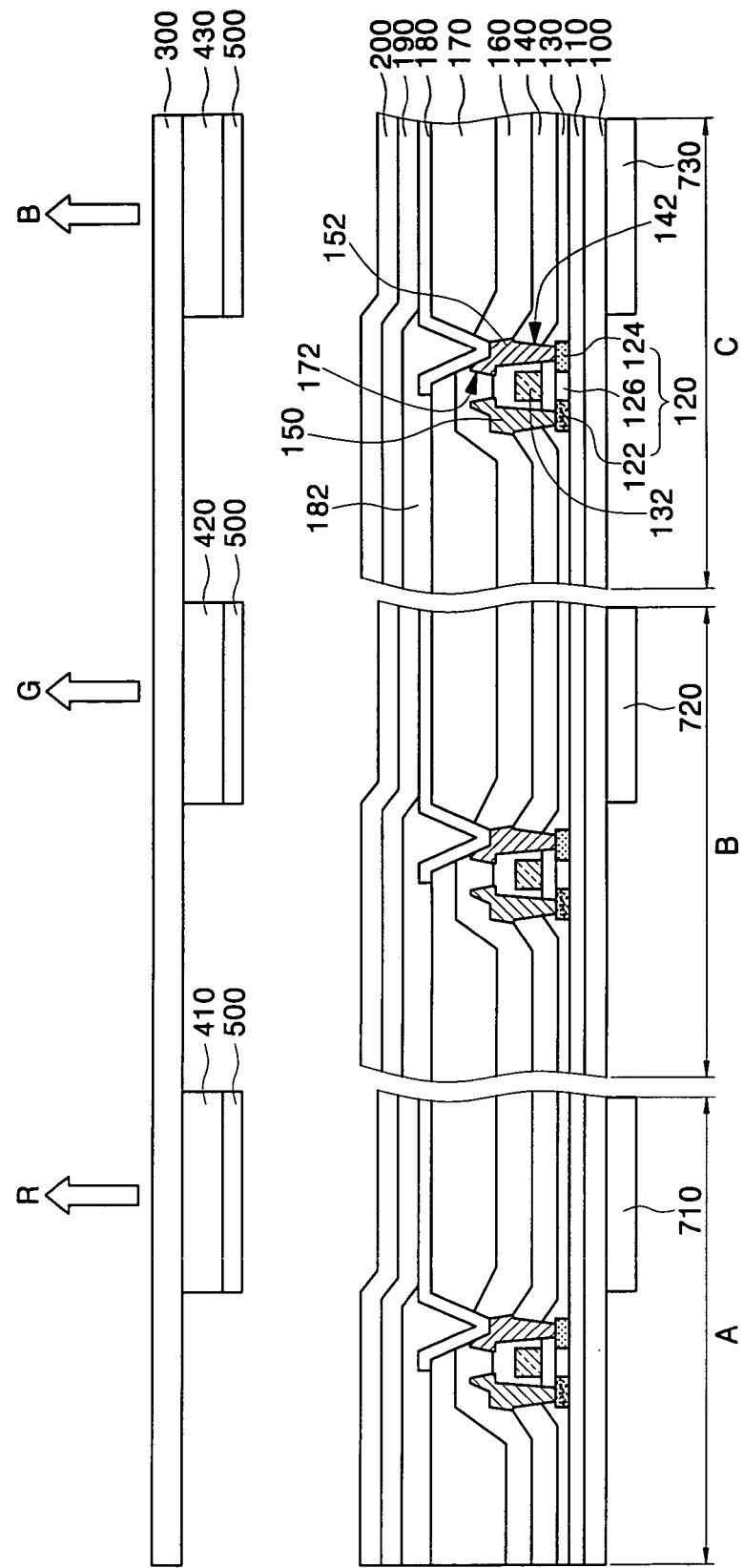
FIG. 1 is a cross-sectional view of a full color OLED in accordance with an exemplary embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a cross-sectional view of a full color OLED in accordance with an exemplary embodiment of the present invention. Referring to FIG. 1, the OLED includes an element substrate 100 and an encapsulating substrate 300. The element substrate 100 includes first color filter layers or color conversion layers ("first color filter/conversion layers") 710, 720, and 730 on one surface thereof, a thin film transistor including a gate electrode 132 and source and drain electrodes 150 and 152 on its other surface, a pixel electrode 180 coupled with either the source or drain electrode 150 or 152, an organic emission layer 190 arranged on the pixel electrode 180, and a counter electrode 200. The encapsulating substrate 300 includes second color filter layers or color conversion layers ("second color filter/conversion layers") 410, 420, and 430, which have a moisture absorbent 500 and correspond to the organic emission layer 190.

In this case, the first color filter/conversion layers 710, 720, and 730 formed on the element substrate 100 correspond to the organic emission layer 190. Alternatively, the first color filter/conversion layers 710, 720, and 730 may be formed anywhere between the element substrate 100 and the organic emission layer 190. If the first color filter/conversion layers 710, 720, and 730 are formed on the element substrate 100, a separate passivation layer may be formed thereon to prevent the first color filter/conversion layers 710, 720, and 730 from being damaged.

The organic emission layer 190 emits a single color light such as blue or white light, and the second color filter/conversion layers 410, 420, and 430 provide red, green, and blue light, respectively, from the light emitted from the organic emission layer 190.

Figure 2:
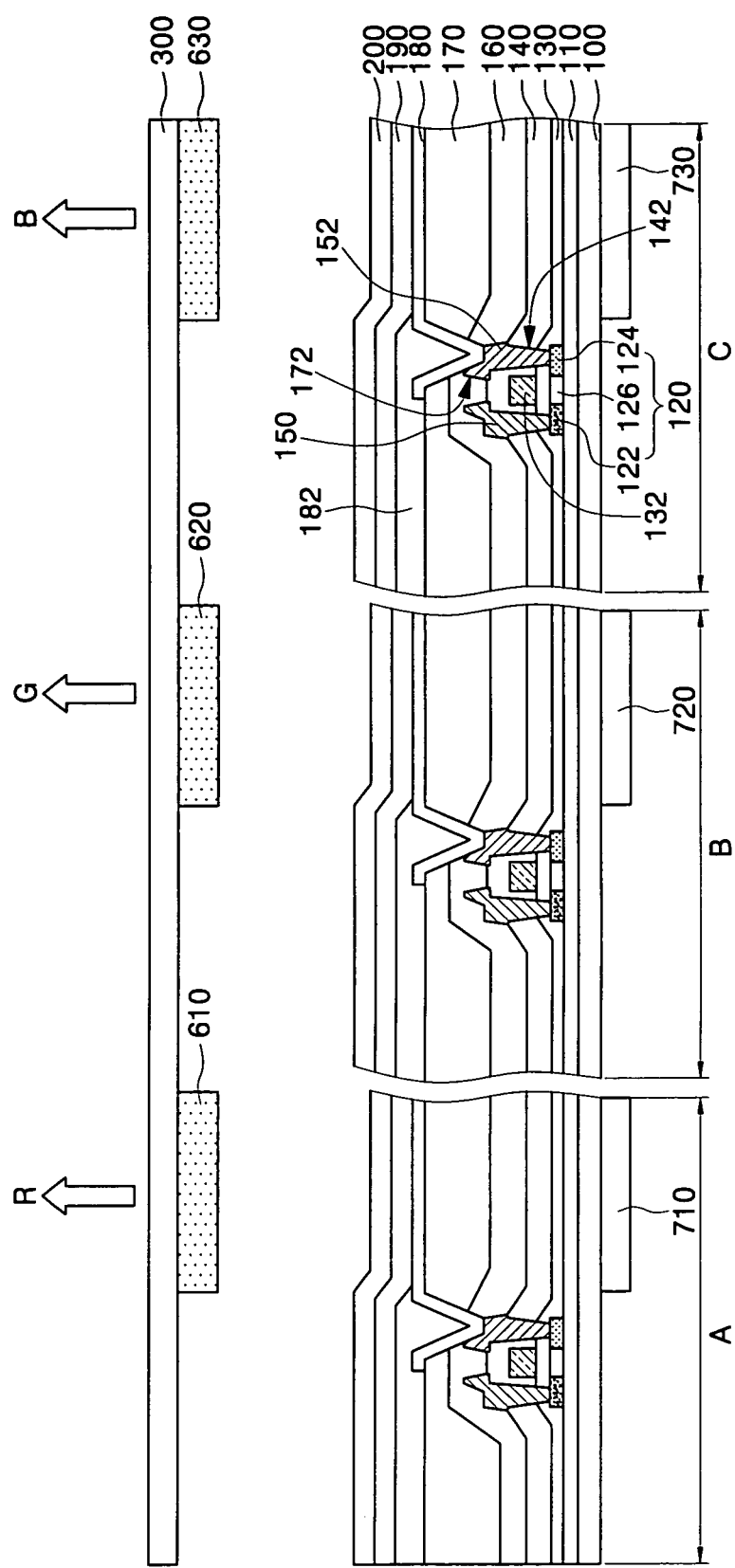
FIG. 2 is a cross-sectional view of a full color OLED in accordance with another exemplary embodiment of the present invention.
Figure 3:
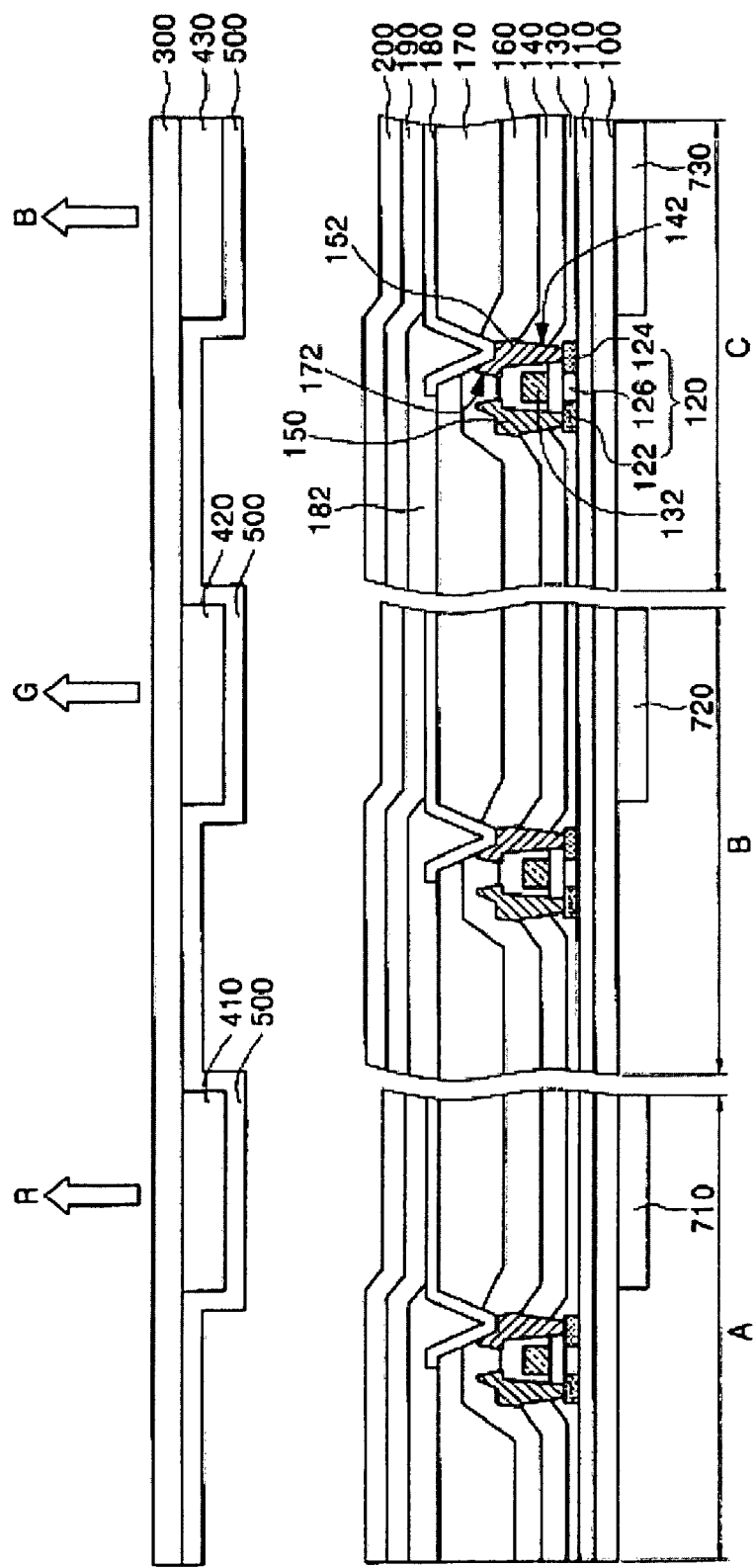
FIG. 3, FIG. 4, and FIG. 5 show a full color OLED in accordance with exemplary embodiments of the present invention.

The moisture absorbent 500 may be arranged on the second color filter/conversion layers 410, 420, and 430, or as shown in FIG. 3, it may be formed on the entire surface of the encapsulating substrate 300, including on the second color filter/conversion layers 410, 420, and 430. Alternatively, as FIG. 2 shows, color filter/conversion layers 610, 620, and 630 may be formed including the moisture absorbent.

The following exemplary embodiment will describe the first color filter/conversion layers 710, 720, and 730 and the second first color filter/conversion layers 410, 420, and 430 as color filter layers. The color filter layers 410, 420, 430, 710, 720, and 730 may include pigment and high molecular binder, and they may be classified into red color filter layers 410 and 710, green color filter layers 420 and 720, and blue color filter layers 430 and 730 depending on the kind of pigment. The red color filter layers 410 and 710, the green color filter layers 420 and 720, and the blue color filter layers 430 and 730 allow light incident from the organic emission layer 190 to be transmitted by a wavelength of red region, a wavelength of green region, and a wavelength of blue region, respectively.

Figure 4:
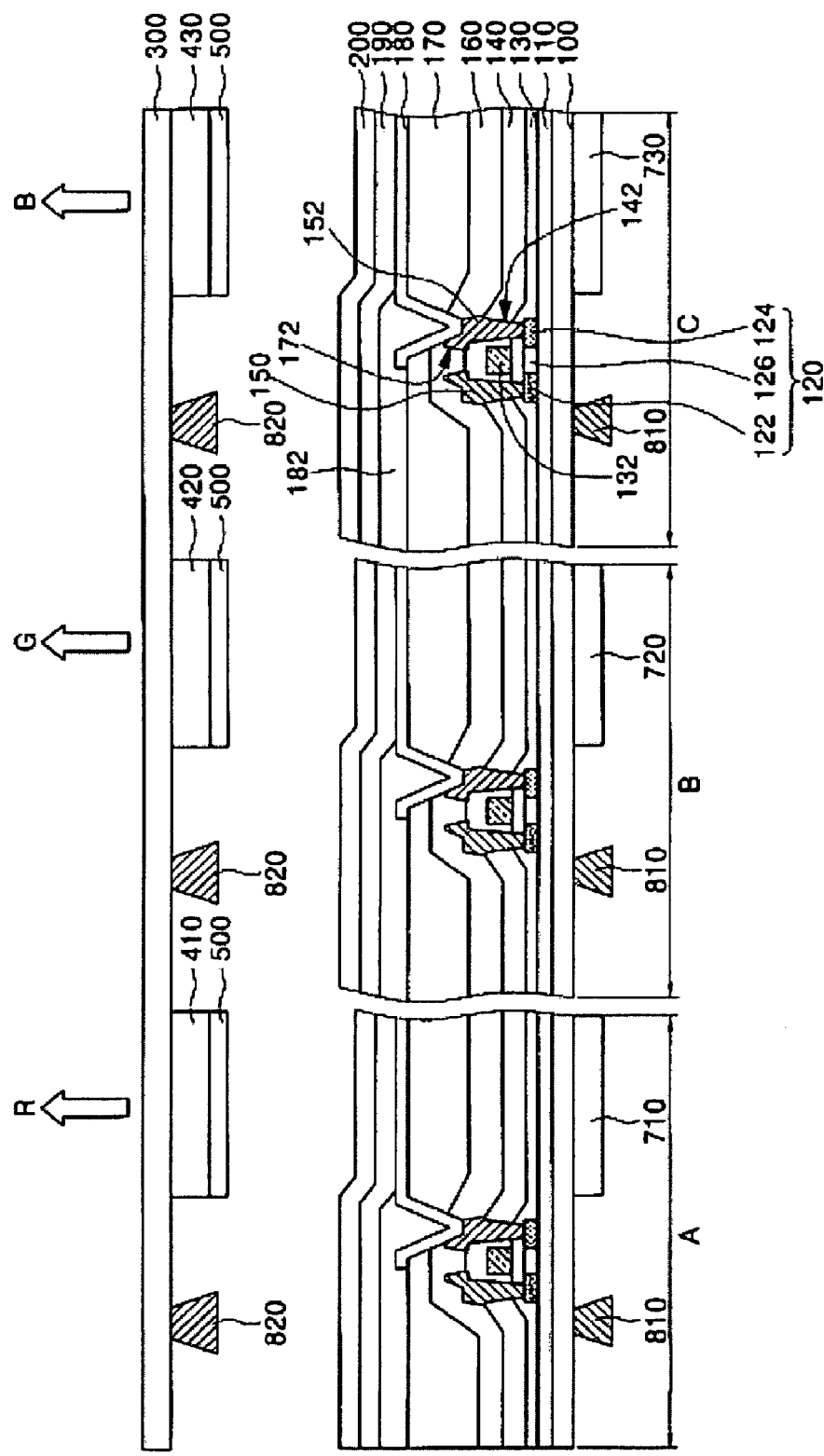

The color filter layers 410, 420, 430, 710, 720, and 730 may be formed by a laser induced thermal imaging (LITI) method. If using the LITI method, a donor film for forming the color filter layers 410, 420, 430, 710, 720, and 730 is prepared by forming a light-heat conversion layer on a base film and forming a transfer layer for the color filter layer on the light-heat conversion layer. The donor film may then be arranged on the encapsulating substrate 300 and the element substrate 100 such that the transfer layer for the color filter layer faces the encapsulating substrate 300 and the element substrate 100, and a laser is irradiated on the base film of the donor film to transfer the transfer layer for the color filter layer onto the encapsulating substrate 300 and the element substrate 100, thereby forming the color filter layers 410, 420, 430, 710, 720, and 730. By doing so, the red color filter layers 410 and 710, the green color filter layers 420 and 720, and the blue color filter layers 430 and 730 may be formed on the encapsulating substrate 300 and the element substrate 100, respectively. Alternatively, the color filter layers 410, 420, 430, 710, 720, and 730 may be formed by a photolithography method of repeatedly carrying out exposure and development or by an inkjet method. If forming the color filter layers 410, 420, 430, 710, 720, and 730 with the inkjet method, as shown in FIG. 4, barriers 810 may be formed between each of the color filter layers 710, 720, and 730, and barriers 820 may be formed beteen each of the color filter layers 410, 420, and 430 to prevent the color filter layers 410, 420, 430, 710, 720, and 730 from interfering with each other and to prevent color mixing from occurring. Additionally, the barriers 810 and barriers 820 may prevent an emission portion from being damaged due to external pressure.

The following exemplary embodiment will describe the first color filter/conversion layers 710, 720, and 730 and the second first color filter/conversion layers 410, 420, and 430 as color conversion layers. The color conversion layers 410, 420, 430, 710, 720, and 730 may include a fluorescent material and a high molecular binder. The fluorescent material is excited by light incident from the organic emission layer 190, and as it transitions to a ground state, it emits light having a longer wavelength than the incident light. The fluorescent material is classified into red color conversion layers 410 and 710 for converting incident light into red light, green color conversion layers 420 and 720 for converting incident light into green light, and blue color conversion layers 430 and 730 for converting incident light into blue light, depending on the kind of the fluorescent material.

Like the color filter layers 410, 420, 430, 710, 720, and 730, the color conversion layers 410, 420, 430, 710, 720, and 730 may also be formed by a LITI method, a photolithography method, or an inkjet method. In this case, when forming the color conversion layers 410, 420, 430, 710, 720, and 730 by the LITI method, the same method as that of forming the color filter layers may be applied except that a transfer layer for the color conversion layer is formed on the base film. Additionally, when forming the color conversion layers 410, 420, 430, 710, 720, and 730 by the inkjet method, a barrier is formed between the color conversion layers.

Furthermore, color filter/conversion layers 610, 620, and 630 including a moisture absorbent may be formed as described above.

The organic emission layer 190 may be formed of at least two organic thin films, which may emit light having different wavelengths in order to emit a single color light. Additionally, the organic emission layer 190 may be formed of a high molecular weight material and/or a low molecular weight material, and it may be formed on the entire surface of the substrate by spin coating or vacuum deposition.

The organic emission layer 190 preferably emits white light when the color filter layers are formed and blue light when the color conversion layers are formed.

Hereinafter, a method of fabricating the full color OLED according to an exemplary embodiment of the present invention will be described with reference to FIG. 1 and FIG. 2.

Figure 5:
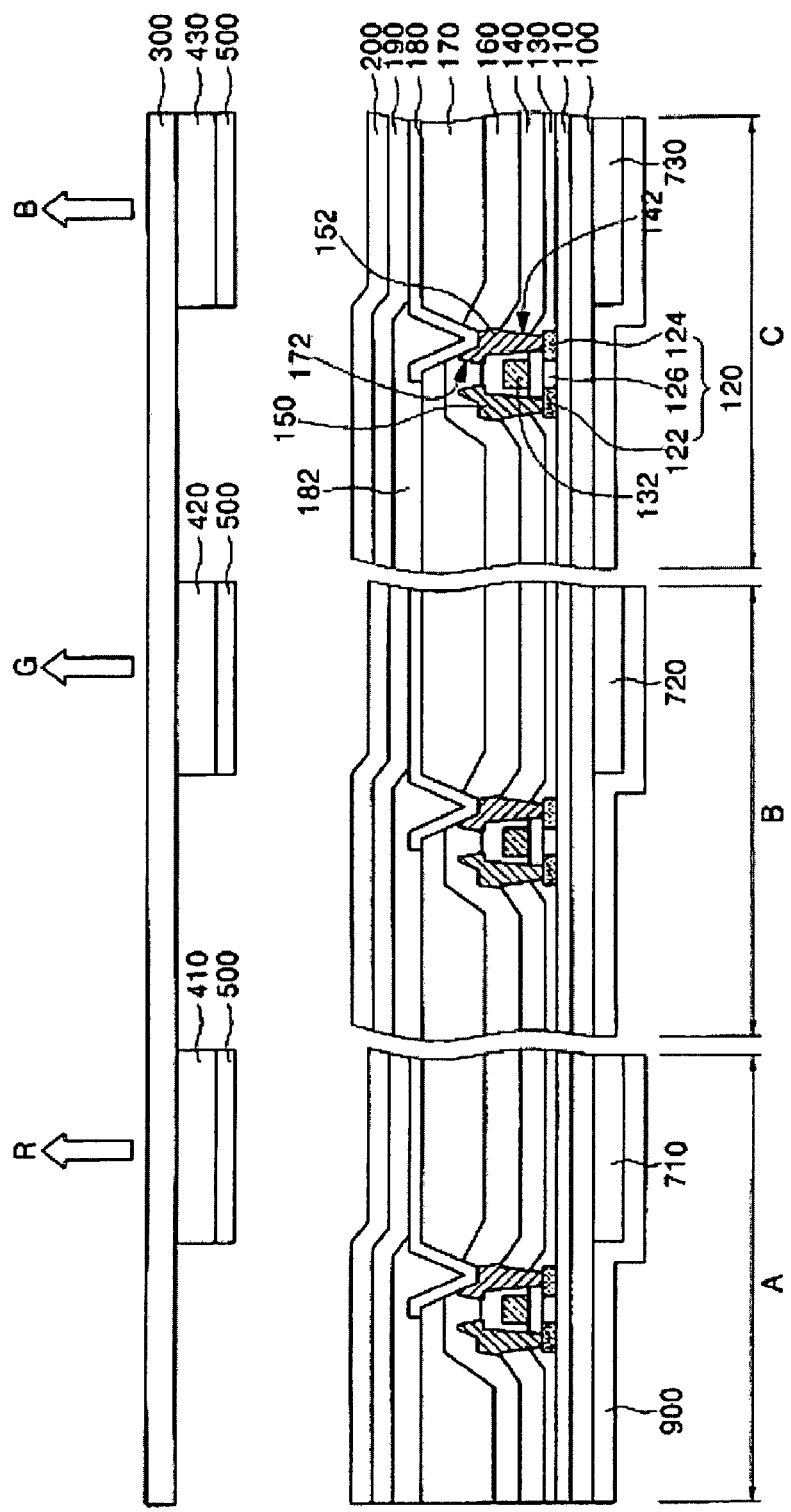

First color filter/conversion layers 710, 720, and 730 are formed on one surface of the element substrate 100, which has red (A), green (B), and blue (C) pixel regions. In this case, the first color filter/conversion layers 710, 720, and 730 may be formed by a LITI method, a photolithography method, or an inkjet method, and barriers 810 may be formed between the first color filter/conversion layers 710, 720, and 730 if they are formed by the inkjet method, as described above. Alternatively, the first color filter/conversion layers 710, 720, and 730 may be formed anywhere between the element substrate 100 and the organic emission layer 190. For example, they may be formed between the organic emission layer 190 and the pixel electrode 180, or between the pixel electrode 180 and a planarization layer 170. If the first color filter/conversion layers 710, 720, and 730 are formed on one surface of the element substrate 100, as shown in FIG. 5, a passivation layer 900, which protects the first color filter/conversion layers 710, 720, and 730, may be further formed on the element substrate 100, including on the first color filter/conversion layers 710, 720, and 730.

A buffer layer 110 of a predetermined thickness may then be formed on a surface of the element substrate 100. The buffer layer 110 prevents impurities from the element substrate 100 from flowing into a subsequently formed thin film transistor.

Polycrystalline silicon layer patterns 120 may then be formed on the buffer layer 110, and impurities may be implanted into both sides of the polycrystalline silicon layer patterns 120 to form source regions 122 and drain regions 124 in the respective pixel regions A, B, and C. In this case, a channel region 126 is formed between the source region 122 and the drain region 124.

A gate insulating layer 130 may be formed on the entire surface of the resultant structure, and gate electrodes 132 may be formed to correspond to the channel regions 126 of the polycrystalline silicon layer patterns 120.

An interlayer-insulating layer 140 may then be formed on the entire surface of the resultant structure and etched to form contact holes 142, which expose the source and drain regions 122 and 124. Subsequently, source and drain electrodes 150 and 152 are formed coupled with the source and drain regions 122 and 124, respectively, via the contact holes 142.

A passivation layer 160 and a planarization layer 170 may then be formed on the entire surface of the resultant structure.

The passivation layer 160 and the planarization layer 170 may be etched to form via holes 172, which expose the drain electrodes 152.

Subsequently, pixel electrodes 180, which are coupled with the drain electrodes 152 through the via holes 172, may be formed in the pixel regions A, B, and C. Here, the pixel electrode 180 is preferably a transparent electrode.

A portion of the pixel electrode 180 is then exposed to form a pixel defining layer pattern 182 defining an emission region on the entire surface of the resultant structure.

An organic emission layer 190 and a counter electrode 200 may then be formed on the entire surface of the resultant structure. In this case, the organic emission layer 190 includes an emission layer that emits blue or white light, and the counter electrode 200 is a transparent electrode or a translucent electrode.

A transparent passivation layer (not shown) may then be formed on the counter electrode 200.

Subsequently, an encapsulating substrate 300, which corresponds to the element substrate 100, is prepared. Here, the encapsulating substrate 300 is preferably transparent.

Second color filter/conversion layers 410, 420, and 430 are formed on the encapsulating substrate 300, that is, a portion corresponding to the emission region of the element substrate 100. If the organic emission layer 190 emits white light, second color filter layers 410, 420, and 430 may be formed on the encapsulating substrate 300. On the other hand, if the organic emission layer 190 emits blue light, second color conversion layers 410 and 420 may be formed on the encapsulating substrate 300. In this case, if the organic emission layer 190 emits blue light, the color conversion layers 430 need not be formed in the blue color pixel region (C) of the encapsulating substrate 300. The second color filter/conversion layers 410, 420, and 430 may be formed by a LITI method, a photolithography method, or an inkjet method. Barriers 820 may be formed between the second color filter/conversion layers 410, 420, and 430 if they are formed by the inkjet method, as described above.

A moisture absorbent 500 may be formed on the second color filter/conversion layers 410, 420, and 430, or on the entire surface of the encapsulating substrate 300 including the second color filter/conversion layers 410, 420, and 430.

The moisture absorbent 500 includes a component that is capable of absorbing moisture and oxygen, and it is formed of a transparent material. For example, the moisture absorbent 500 may include a nano particle moisture absorbent having $SiO_2$ as its main component, a chemical reactive moisture absorbent having CaO dispersoid as its main component, a nano particle/chemical reactive moisture absorbent having $SiO_2$ and $CaCl_2$ as its main component, and an organic-inorganic moisture absorbent having an organic-inorganic composite moisture absorbent as its main component.

Alternatively, the moisture absorbent may be a transparent material that is mixed with the color filter/conversion layers 610, 620, and 630, as shown in FIG. 2.

Table 1 shows the main component, test cell acceleration storage lifetime, and formation method of the moisture absorbent.

TABLE 1

| | Main component | Test cell acceleration storage lifetime (hr) | Coating method |
|---|---|---|---|
| Nano particle moisture absorbent | $SiO_2$ | 75 | Screen printing |
| Nano particle/chemical reactive moisture absorbent | $SiO_2$ + $CaCl_2$ | 168 | Screen printing |
| Chemical reactive moisture absorbent | CaO dispersoid | 560 | Spray coating |
| Organic-inorganic moisture absorbent | Organic-inorganic composite moisture absorbent | 400 | Screen printing |

The moisture absorbent 500 may be formed on the surface of the second color filter/conversion layers 410, 420, and 430 of the encapsulating substrate 300 as described above, so that a separate space for mounting the moisture absorbent 500 is not required and physical damage of the second color filter/conversion layers 410, 420, and 430 may be prevented.

According to exemplary embodiments of the present invention as described above, a color filter layer or a color conversion layer may be formed on the encapsulating substrate, and a moisture absorbent may be formed on the color filter layer or the color conversion layer, or the color filter layer or the color conversion layer may be formed containing the moisture absorbent, so that a process thereof may be simplified without affecting optical characteristics and a high resolution display device may be advantageously realized.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A full color organic light emitting display device (OLED), comprising:

an element substrate including a pixel electrode, an organic layer comprising an emission layer, and a counter electrode;

an encapsulating substrate coupled with the element substrate;

either a first color filter layer or a first color conversion layer arranged on the element substrate; and either a second color filter layer or a second color conversion layer having a moisture absorbent and arranged on the encapsulating substrate to correspond to the emission layer, wherein the emission layer emits light of a single color, and wherein either the first color filter layer or the first color conversion layer is arranged directly on a first side of the element substrate, the pixel electrode is arranged on a second side of the element substrate, and the first side differs from the second side.

2. The OLED of claim 1, further comprising:

a thin film transistor arranged between the element substrate and the pixel electrode and electrically coupled with the pixel electrode.

3. The OLED of claim 1, wherein the pixel electrode and the counter electrode are transparent electrodes.

4. The OLED of claim 1, wherein the first color filter layer is arranged on the element substrate, the second color filter layer is arranged on the encapsulating substrate, and the emission layer emits white light.

5. The OLED of claim 1, wherein the first color conversion layer is arranged on the element substrate, the second color conversion layer is arranged on the encapsulating substrate, and the emission layer emits blue light.

6. The OLED of claim 1, wherein the moisture absorbent comprises a transparent material.

7. The OLED of claim 1, wherein the moisture absorbent comprises at least one moisture absorbent selected from the group consisting of a nano particle moisture absorbent, a chemical reactive moisture absorbent, and an organic-inorganic moisture absorbent.

8. The OLED of claim 1, wherein the moisture absorbent is arranged on an entire surface of the encapsulating substrate including either the second color filter layer or the second color conversion layer.

9. The OLED of claim 1, wherein the moisture absorbent is included within either the second color conversion layer or the second color filter layer.

10. The OLED of claim 1, further comprising:

a barrier arranged between color filter layers or between color conversion layers.

11. The OLED of claim 1, further comprising:

a passivation layer covering either the first color filter layer or the first color conversion layer.

* * * * *

UNITED STATES PATENT AND TRADEMARK OFFICE
CERTIFICATE OF CORRECTION

PATENT NO.       : 7,659,661 B2                              Page 1 of 1
APPLICATION NO. : 11/273088
DATED            : February 9, 2010
INVENTOR(S)      : Joon-Young Park It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 775 days.

Signed and Sealed this

Twenty-eighth Day of December, 2010

David J. Kappos
*Director of the United States Patent and Trademark Office*